US010249402B2

(12) United States Patent
Hosono et al.

(10) Patent No.: US 10,249,402 B2
(45) Date of Patent: Apr. 2, 2019

(54) C12A7 ELECTRIDE THIN FILM FABRICATION METHOD AND C12A7 ELECTRIDE THIN FILM

(71) Applicants: TOKYO INSTITUTE OF TECHNOLOGY, Meguro-ku (JP); ASAHI GLASS COMPANY, LIMITED, Chiyoda-ku (JP); JAPAN SCIENCE AND TECHNOLOGY AGENCY, Kawaguchi-shi (JP)

(72) Inventors: Hideo Hosono, Meguro-ku (JP); Yoshitake Toda, Meguro-ku (JP); Katsuro Hayashi, Meguro-ku (JP); Setsuro Ito, Meguro-ku (JP); Satoru Watanabe, Chiyoda-ku (JP); Naomichi Miyakawa, Chiyoda-ku (JP); Toshinari Watanabe, Chiyoda-ku (JP); Kazuhiro Ito, Chiyoda-ku (JP)

(73) Assignees: TOKYO INSTITUTE OF TECHNOLOGY, Meguro-ku (JP); AGC Inc., Chiyoda-ku (JP); JAPAN SCIENCE AND TECHNOLOGY AGENCY, Kawaguchi-shi (JP)

( * ) Notice: Subject to any disclaimer, the term of this patent is extended or adjusted under 35 U.S.C. 154(b) by 468 days.

(21) Appl. No.: 14/567,047

(22) Filed: Dec. 11, 2014

(65) Prior Publication Data
US 2015/0093583 A1 Apr. 2, 2015

Related U.S. Application Data

(63) Continuation of application No. PCT/JP2013/066850, filed on Jun. 19, 2013.

(30) Foreign Application Priority Data

Jun. 20, 2012 (JP) .................................. 2012-139197
Jul. 5, 2012 (JP) .................................. 2012-151848

(Continued)

(51) Int. Cl.
*C23C 14/34* (2006.01)
*H01B 1/08* (2006.01)
(Continued)

(52) U.S. Cl.
CPC ............... *H01B 1/08* (2013.01); *C04B 35/44* (2013.01); *C04B 35/62645* (2013.01);
(Continued)

(58) Field of Classification Search
CPC .................................................... C23C 14/082
See application file for complete search history.

(56) References Cited

U.S. PATENT DOCUMENTS

2006/0151311 A1 7/2006 Hosono et al.
2008/0265774 A1* 10/2008 Webster .................... H01J 9/02
313/587

(Continued)

FOREIGN PATENT DOCUMENTS

CN 101527321 A 9/2009
CN 102459082 A 5/2012
(Continued)

OTHER PUBLICATIONS

Sung Wng Kim, et al., "Solvated Electrons in High-Temperature Melts and Glasses of the Room-Temperature Stable Electride $[Ca_{24}Al_{28}O_{64}]^{4+} \cdot 4e^{-}$", Science, vol. 333, No. 6038, XP055241613, Jul. 1, 2011, pp. 71-74.

(Continued)

*Primary Examiner* — Jason Berman
(74) *Attorney, Agent, or Firm* — Oblon, McClelland, Maier & Neustadt, L.L.P.

(57) ABSTRACT

A C12A7 electride thin film fabrication method includes a step of forming an amorphous C12A7 electride thin film on a substrate by vapor deposition under an atmosphere with an oxygen partial pressure of less than 0.1 Pa using a target made of a crystalline C12A7 electride having an electron density within a range of $2.0 \times 10^{18}$ cm$^{-3}$ to $2.3 \times 10^{21}$ cm$^{-3}$.

12 Claims, 10 Drawing Sheets

(30) Foreign Application Priority Data

| | | |
|---|---|---|
| Feb. 27, 2013 | (JP) | 2013-037851 |
| Mar. 29, 2013 | (JP) | 2013-071154 |
| Mar. 29, 2013 | (JP) | 2013-071163 |

(51) Int. Cl.
*C23C 14/08* (2006.01)
*C23C 14/35* (2006.01)
*C04B 35/44* (2006.01)
*C04B 35/626* (2006.01)
*H01L 51/52* (2006.01)

(52) U.S. Cl.
CPC ............ *C23C 14/08* (2013.01); *C23C 14/082* (2013.01); *C23C 14/3414* (2013.01); *C23C 14/35* (2013.01); *C04B 2235/3208* (2013.01); *C04B 2235/664* (2013.01); *H01L 51/5221* (2013.01)

(56) References Cited

U.S. PATENT DOCUMENTS

| | | | |
|---|---|---|---|
| 2009/0045438 A1 | 2/2009 | Inoue et al. | |
| 2009/0218570 A1* | 9/2009 | Ha | H01L 29/7869 257/59 |
| 2009/0314991 A1 | 12/2009 | Cho et al. | |

FOREIGN PATENT DOCUMENTS

| | | | |
|---|---|---|---|
| JP | 02115361 A | * | 4/1990 |
| JP | 5-41285 A | | 2/1993 |
| JP | 2006-134691 A | | 5/2006 |
| JP | 2008-195583 | | 8/2008 |
| JP | 2009-212520 | | 9/2009 |
| JP | 2010-45228 A | | 2/2010 |
| JP | 2013-40088 | | 2/2013 |
| WO | WO 2005/000741 | | 1/2005 |
| WO | WO 2012/056674 A1 | | 5/2012 |

OTHER PUBLICATIONS

P. H. Tai, et al., "Electrical and optical properties of $12CaO \cdot 7Al_2O_3$ electride doped indium tin oxide thin film deposited by RF magnetron co-sputtering", Thin Solid Films, vol. 517, No. 23, XP026459591, Mar. 18, 2009, pp. 6294-6297.

Sung-Wng Kim, et al., "Fabrication of room temperature-stable $12CaO \cdot 7Al_2O_3$ electride: a review" J. Mater. Sci: Mater Electron, vol. 18, 2007, pp. S5-S14.

U.S. Appl. No. 14/566,755, filed Dec. 11, 2014, Hosono, et al.

F.M. Lea and C.H. Desch, The Chemistry of Cement and Concrete, $2^{nd}$ Ed., p. 52, Edward Arnold & Co., London, 1956.

O. Yamaguchi et al. "New Compound in the System $SrO-Al_2O_3$", J. Am, Ceram. Soc. 1986, 69, C-36.

International Search Report issued in PCT/JP2013/066850, dated Sep. 17, 2013.

Masashi Miyakawa, "Fabrication of high-density electron-dope $12CaO \cdot 7Al_2O_3$ thin films by physical and chemical processed"; Journal of the Ceramic Society of Japan, vol. 117[3], pp. 395-401, 2009.

Hideo Hosono et al., "Thin film and bulk fabrication of room-temperature-stable electride $C127A7:e^-$ utilizing reduced amorphous $12CaO \cdot 7Al_2O_3(C12A7)$"; Journal of Non-Crystalline Solids, vol. 354 (2008); pp. 2772-2776.

Masashi Miyakawa et al., "Novel Room Temperature Stable Electride $12SrO \cdot 7Al_2O_3$ Thin Films: Fabrication, Optical and Electron Transport Properties"; Journal of the Ceramic Society of Japan, vol. 115, pp. 567-570, 2007.

* cited by examiner

C12A7 ELECTRIDE THIN FILM FABRICATION METHOD AND C12A7 ELECTRIDE THIN FILM

CROSS-REFERENCE TO RELATED APPLICATION

The present application is a continuation application filed under 35 U.S.C. 111(a) claiming benefit under 35 U.S.C. 120 and 365(c) of PCT International Application No. PCT/JP2013/066850 filed on Jun. 19, 2013 and designating the U.S., which claims priority to Japanese Patent Application No. 2012-139197 filed on Jun. 20, 2012, Japanese Patent Application No. 2012-151848 filed on Jul. 5, 2012, Japanese Patent Application No. 2013-037851 filed on Feb. 27, 2013, Japanese Patent Application No. 2013-071154 filed on Mar. 29, 2013, and Japanese Patent Application No. 2013-071163 filed on Mar. 29, 2013. The entire contents of the foregoing applications are incorporated herein by reference.

BACKGROUND OF THE INVENTION

1. Field of the Invention

The present invention relates to a C12A7 electride thin film fabrication method and a C12A7 electride thin film.

2. Description of the Related Art

Crystalline C12A7 has a representative composition expressed as $12CaO \cdot 7Al_2O_3$ (hereinafter referred to as "C12A7") and has a characteristic crystal structure including voids (cages) with diameters of about 0.4 nm that are linked three-dimensionally. The lattice framework forming the cages is positively charged and forms 12 cages per unit cell. One-sixth (⅙) of the cages are occupied by oxygen ions in order to satisfy an electrically neutral condition of the crystal. These oxygen ions are particularly referred to as free oxygen ions because they have properties chemically different from those of the other oxygen ions constituting the framework. Crystalline C12A7 is also denoted as $[Ca_{24}Al_{28}O_{64}]^{4+} \cdot 2O^{2-}$ (see F. M. Lea and C. H. Desch, The Chemistry of Cement and Concrete, 2nd ed., p. 52, Edward Arnold & Co., London, 1956).

Also, $12SrO \cdot 7Al_2O_3$ (hereinafter referred to as "S12A7") is known as an isomorphic compound of crystalline C12A7, and a mixed crystal compound of C12A7 and S12A7 containing Ca and Sr at a given mix ratio is also known (see O. Yamaguchi, A. Narai, K. Shimizu, J. Am. Ceram. Soc. 1986, 69, C36).

The inventors of the present invention, Hosono et al., have discovered that by subjecting crystalline C12A7 powder or a sintered body thereof to a heating process in a $H_2$ atmosphere to cause the cages to contain H-ions and subsequently irradiating ultraviolet light thereon, the crystalline C12A7 powder or the sintered body may be arranged to contain electrons in the cages and be able to exhibit permanent conductive properties at room temperature (see WO 2005/000741). The electrons contained are loosely bound to the cages and can move freely in the crystals, and as such, crystalline C12A7 exhibits conductive properties.

Crystalline C12A7 having such conductive properties is referred to as a crystalline C12A7 electride. Because crystalline C12A7 electrides have a very low work function of about 2.4 eV, advantageous effects can be expected by applying crystalline C12A7 electrides to electron injection electrodes of organic EL (electroluminescence) elements and cold electron emission sources, or reducing agents used in chemical reactions, for example.

Generally, a crystalline C12A7 bulk is fabricated by performing a sintering process on crystalline C12A7 electride powder under a high-temperature reducing atmosphere (Patent Document 1). For example, the temperature of the sintering process may be about 1200° C.

Although the above conventional method may be effective for fabricating the crystalline C12A7 in bulk, the method is not suitable for fabricating a crystalline C12A7 electride thin film.

That is, in the case of fabricating a crystalline C12A7 electride thin film using a conventional method requiring a high temperature of about 1200° C., for example, materials that may be used as the substrate of the thin film may be limited to heat resistant materials. As a result, the combination of the types of materials that may be used for the thin film and the substrate may be very limited.

For example, a glass substrate is often used as a versatile substrate for various types of electrical devices and elements. However, the temperature limit for a glass substrate is about 700° C. at most. Accordingly, it would be difficult to form a crystalline C12A7 electride thin film on a glass substrate using a conventional fabrication method owing to the temperature limit of the glass substrate.

In light of the above, there is a growing demand for a technique for fabricating a C12A7 electride thin film under a low processing temperature to avoid or alleviate the above-described shortcomings.

SUMMARY OF THE INVENTION

The present invention has been conceived in view of the foregoing problems associated with the prior art, and it is an object of the present invention to provide a technique for fabricating a C12A7 electride thin film under a relatively low processing temperature.

According to one embodiment of the present invention, a C12A7 electride thin film fabrication method is provided that includes a step of forming an amorphous C12A7 electride thin film on a substrate by vapor deposition under an atmosphere with an oxygen partial pressure of less than 0.1 Pa using a target made of a crystalline C12A7 electride having an electron density within a range of $2.0 \times 10^{18}$ cm$^{-3}$ to $2.3 \times 10^{21}$ cm$^{-3}$.

According to another embodiment of the present invention, a C12A7 electride thin film is provided that is characterized by having an electron density within a range greater than or equal to $2.0 \times 10^{18}$ cm$^{-3}$ and less than or equal to $2.3 \times 10^{21}$ cm$^{-3}$; exhibiting light absorption at a photon energy position of 4.6 eV; and being amorphous.

According to another embodiment of the present invention, a fabrication method is provided that includes a step of forming an amorphous thin film by vapor deposition under an atmosphere with an oxygen partial pressure of less than 0.1 Pa using a target made of a crystalline C12A7 electride having an electron density within a range of $2.0 \times 10^{18}$ cm$^{-3}$ to $2.3 \times 10^{21}$ cm$^{-3}$.

According to another embodiment of the present invention, an amorphous thin film is provided that is fabricated using a target made of a crystalline C12A7 electride and includes an electride of an amorphous solid material including calcium, aluminum, and oxygen, wherein the Al/Ca molar ratio is within a range of 0.5 to 4.7.

DESCRIPTION OF THE PREFERRED EMBODIMENTS

Figure 1:
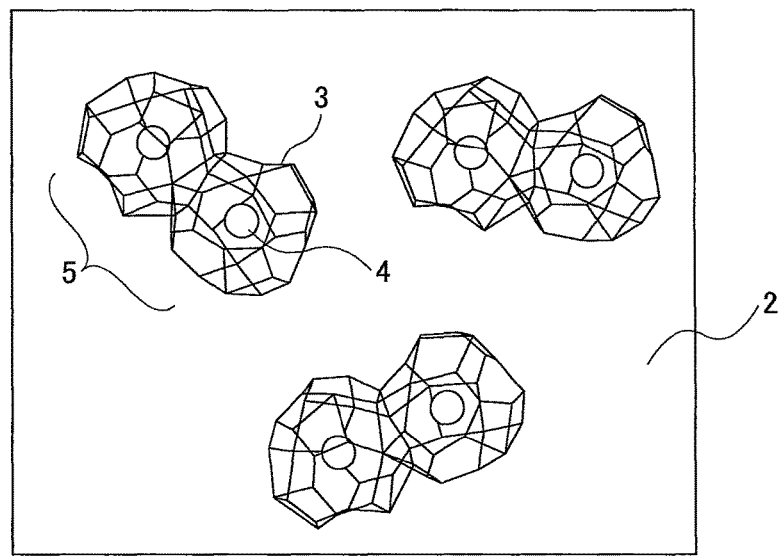
FIG. 1 schematically illustrates a structure of an amorphous C12A7 electride.

First, definitions of terms used in the present description are given below.

(Crystalline C12A7)

In the present description, "crystalline C12A7" refers to $12CaO.7Al_2O_3$ crystals and isomorphic compounds having a crystal structure similar to the C127A crystal structure. The mineral name of this compound is "mayenite".

Crystalline C127A may include compounds in which a part or all of Ca atoms and/or Al atoms in the C12A7 crystal framework are replaced by other atoms to the extent that the framework of the C12A7 crystal lattice and the cage structure formed by the framework are retained. Crystalline C127A may also include isomorphic compounds in which a part or all of free oxygen ions in cages are replaced by other anions to the extent that the framework of the C12A7 crystal lattice and the cage structure formed by the framework are retained. Note that C12A7 may be represented as $Ca_{12}Al_{14}O_{33}$ or $Ca_{24}Al_{28}O_{66}$ in some cases.

Although not limited thereto, isomorphic compounds may include the following compounds (1)-(5), for example.

(1) Isomorphic compounds in which a part or all of Ca atoms in the crystal are replaced by at least one type of metal atoms selected from a group consisting of Sr, Mg, and Ba. For example, a compound having a part or all of Ca atoms replaced by Sr includes strontium aluminate ($Sr_{12}Al_{14}O_{33}$), and a mixed crystal including Ca and Sr at an arbitrary mix ratio includes calcium strontium aluminate ($Ca_{12-x}Sr_xAl_{14}O_{33}$, where X is an integer within the range from 1 to 11, or a number greater than 0 and less than 12 in the case where X represents a mean value).

(2) Isomorphic compounds in which a part or all of Al atoms in the crystal are replaced by at least one type of atom selected from a group consisting of Si, Ge, Ga, In, and B. $Ca_{12}Al_{10}Si_4O_{35}$ is an example of such a compound.

(3) Isomorphic compounds in which a part of metal atoms and/or non-metal atoms (except for oxygen atoms) in the $12CaO.7Al_2O_3$ crystal (including the above compounds (1) and (2)) are replaced by at least one type of transition metal atoms selected from a group consisting of Ti, V, Cr, Mn, Fe, Co, Ni, and Cu; at least one type of alkali metal atoms selected from a group consisting of typical metal atoms, Li, Na, and K; or at least one type of rare earth atoms selected from a group consisting of Ce, Pr, Nd, Sm, Eu, Gd, Tb, Dy, Ho, Er, Tm, and Yb.

(4) Compounds in which a part or all of free oxygen ions contained in the cages are replaced by other anions. Examples of other anions include, for example, $H^-$, $H_2^-$, $H^{2-}$, $O^-$, $O_2^-$ $OH^-$, $F^-$, $Cl^-$, $S^{2-}$ and nitrogen (N) anions.

(5) Compounds in which a part of the oxygen in the cage framework is replaced by nitrogen (N) and the like.

(Crystalline C12A7 Electride)

In the present descriptions, "crystalline C12A7 electride" refers to compounds in which a part or all of the free oxygen ions contained in the cages (and other anions in the case where other anions are contained in the cages) of the crystalline C12A7 are replaced by electrons.

The electrons contained in the cages of the crystalline C12A7 electride are loosely bound to the cages and can move freely in the crystals. Thus, crystalline C12A7 electrides exhibit conductive properties. Note that a crystalline C12A7 compound having all of its free oxygen ions replaced by electrons may be expressed as $[Ca_{24}Al_{28}O_{64}]^{4+}$ $(4e^-)$ in some cases.

(Amorphous C12A7 Electride)

In the present description, "amorphous C12A7 electride" refers to an amorphous solid material made of a solvation of amorphous C12A7 as the solvent and electrons as the solute and having the same composition as the crystalline C12A7 electride.

FIG. 1 schematically illustrates the structure of an amorphous C12A7 electride.

Generally, in the crystalline C12A7 electride, cages share walls to form a three-dimensional crystal lattice structure, and electrons are contained in some of the cages. On the other hand, as illustrated in FIG. 1, the amorphous C12A7 electride has characteristic partial structures called bipolaron 5 dispersed within a solvent 2 made of amorphous C12A7. The bipolaron 5 includes two adjoining cages 3 with each cage 3 containing an electron (solute) 4. Note, however, that the structure and state of the amorphous C12A7 electride is not limited to the above-described example. In other examples, each cage 3 may be arranged to contain two electrons (solute) 4.

Also, a plurality of the cages may be agglomerated in which case the agglomerated cages may be regarded as a microcrystal. Thus, the amorphous C12A7 of the present invention may include C12A7 with amorphous structures including microcrystals.

The amorphous C12A7 electride has semiconductor-like electrical properties and has a low work function. The work function of the amorphous C12A7 electride may be within a range of 2.4 eV to 4.5 eV, or a range of 3 eV to 4 eV, for example. The work function of the amorphous C12A7 electride is preferably within a range of 2.8 eV to 3.2 eV. Also, the amorphous C12A7 electride has high ionization potential. The ionization potential of the amorphous C12A7 electride may be within a range of 7.0 eV to 9.0 eV, or within a range of 7.5 eV to 8.5 eV, for example.

The bipolaron 5 hardly shows light absorption at the visible light range with a photon energy range of 1.55 eV to 3.10 eV, but shows light absorption at around 4.6 eV. Thus, an amorphous C12A7 electride thin film is transparent with respect to visible light. Also, a sample may be tested to determine whether it contains bipolaron 5, namely, whether the sample includes an amorphous C12A7 electride, by measuring the light absorption characteristics of the sample and measuring its light absorption coefficient at around 4.6 eV.

Also, the two adjoining cages 3 forming the bipolaron 5 are Raman active and may show a characteristic peak around 186 $cm^{-1}$ upon being measured by Raman spectroscopy.

(C12A7 Electride)

In the present description, "C12A7 electride" includes both crystalline C12A7 electrides and amorphous C12A7 electrides described above.

Note that the crystalline C12A7 electride includes Ca atoms, Al atoms, and O atoms, wherein the Ca:Al molar ratio is within a range of 13:13 to 11:15. The Ca:Al molar ratio of the crystalline C12A7 electride is preferably within a range of 12.5:13.5 to 11.5:14.5, and more preferably within a range of 12.2:13.8 to 11.8:14.2.

The amorphous C12A7 electride includes Ca atoms, Al atoms, and O atoms, wherein the Ca:Al molar ratio is within a range of 13:12 to 11:16. The Ca:Al molar ratio of the amorphous C12A7 electride is preferably within a range of 13:13 to 11:15, and more preferably within a range of 12.5:13.5 to 11.5:14.5. Further, as described below, an amorphous C12A7 electride thin film is preferably arranged such that 67%, more preferably 80%, and more preferably 95%, of the Ca, Al, and O included therein are within the above composition ranges.

Embodiment of Present Invention

According to one embodiment of the present invention, a C12A7 electride thin film fabrication method is provided that includes:

(a) a step of preparing a target made of a crystalline C12A7 electride having an electron density of $2.0\times10^{18}$ $cm^{-3}$ to $2.3\times10^{21}$ $cm^{-3}$; and (b) a step of forming an amorphous C12A7 electride thin film on a substrate by vapor deposition under an atmosphere with an oxygen partial pressure of less than 0.1 Pa using the above target.

As described above, the conventional C12A7 electride fabrication method is primarily focused on fabricating the C12A7 electride in bulk and includes a high-temperature heating process at a processing temperature of at least 1200° C., for example. Thus, such a fabrication method is not suited for fabricating a C12A7 electride thin film on a substrate.

Note, in particular, that when implementing the conventional fabrication method, it is difficult to use a non-heat-resistant material as the substrate. Therefore, the material of the substrate is very limited.

In the thin film fabrication method according to the present embodiment, an amorphous C12A7 electride thin film is formed by vapor deposition under a controlled oxygen partial pressure using the crystalline C12A7 electride target.

In the fabrication method according to the present embodiment, a heating process at a high temperature of at least 1200° C., for example, does not have to be performed. That is, according to an aspect of the present embodiment, an amorphous C12A7 electride thin film may be fabricated under a comparatively low processing temperature. In this way, the constraints in view of heat resistance requirements of the substrate material may be relaxed such that the amorphous C12A7 electride thin film may be formed on a wider variety of substrates.

(Fabrication Method of Present Invention)

In the following, a C12A7 electride thin film fabrication method according to an embodiment of the present invention is described with reference to the accompanying drawings.

Figure 2:
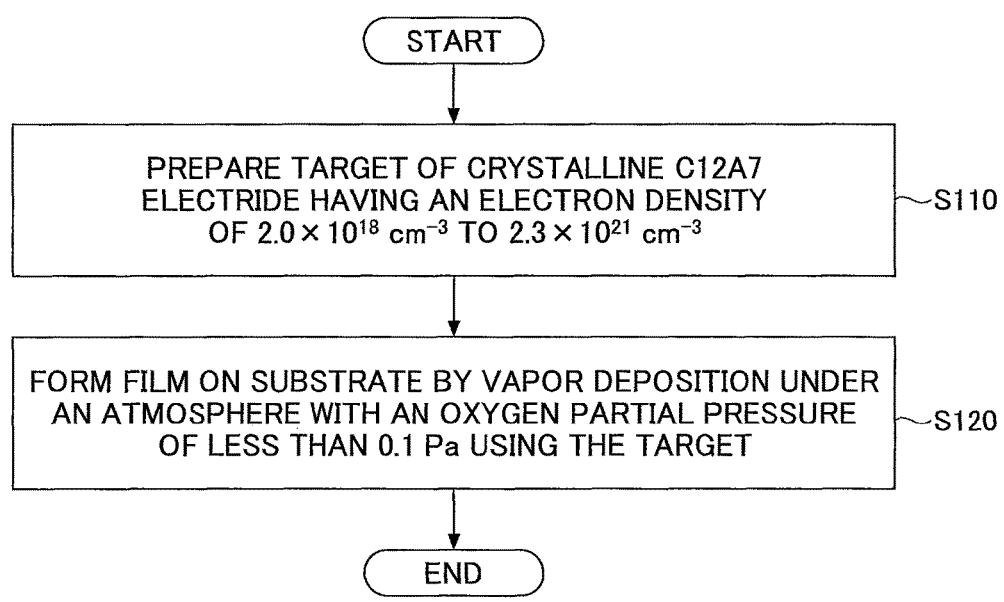
FIG. 2 is a flowchart schematically illustrating a process flow of a C12A7 electride thin film fabrication method according to an embodiment of the present invention.

FIG. 2 schematically illustrates a process flow of the C12A7 electride thin film fabrication method according to the present embodiment.

As illustrated in FIG. 2, the fabrication method according to the present embodiment includes:

a step of preparing a target made of a crystalline C12A7 electride having an electron density of $2.0\times10^{18}$ $cm^{-3}$ to $2.3\times10^{21}$ $cm^{-3}$ (S110); and a step of forming a film on a substrate by vapor deposition under an atmosphere with an oxygen partial pressure of less than 0.1 Pa using the above target (S120).

The above steps are described in greater detail below.

(Step S110)

First, a target for film formation to be used in a subsequent step is prepared.

The target is made of a crystalline C12A7 electride.

The method to be used for fabricating the target made of the crystalline C12A7 electride is not particularly limited. For example, the target may be fabricated using the conventional method for fabricating the crystalline C12A7 electride in bulk as described above. For example, the target made of the crystalline C12A7 electride may be fabricated by performing a heating process on a sintered body of crystalline C12A7 at a temperature of around 1150-1460° C., preferably around 1200-1400° C., under the existence of a reducing agent such as Ti, Al, Ca, or C. In another example, a press-molded powder body formed by press-molding a crystalline C12A7 powder may be used as the target. A large-area target made of the crystalline C12A7 electride may be efficiently fabricated by performing a heating process on a sintered body of crystalline C12A7 at a temperature of 1230-1415° C. under the existence of carbon and metal aluminum while keeping the sintered body from coming into contact with the metal aluminum. Preferably, a target having an area with a diameter of at least 3 inches (76.2 mm) and a thickness of at least 2 mm may be fabricated. More preferably, a target having a large area with a diameter of at least 4 inches (101.6 mm) and a thickness of at least 3 mm may be fabricated.

Note that the electron density of the target, namely, the crystalline C12A7 electride, is within a range of $2.0\times10^{18}$ $cm^{-3}$ to $2.3\times10^{21}$ $cm^{-3}$. The electron density of the crystalline C12A7 electride is preferably at least $1\times10^{19}$ $cm^{-3}$, more preferably, at least $1\times10^{20}$ $cm^{-3}$, and more preferably at least $5\times10^{20}$ $cm^{-3}$, and more preferably at least $1\times10^{21}$ $cm^{-3}$. Note that the higher the electron density of the crystalline C12A7 electride making up the target, the easier it is to obtain an amorphous C12A7 electride having a low work function. Particularly, to obtain an amorphous C12A7 electride having a work function of 3.0 eV or lower, the electron density of the crystalline C12A7 electride is preferably at least $1.4 \times 10^{21}$ cm$^{-3}$, more preferably at least $1.7 \times 10^{21}$ cm$^{-3}$, and more preferably at least $2 \times 10^{21}$ cm$^{-3}$. Further, in a case where all the free oxygen ions (and other anions if other anions are included) of the crystalline C12A7 electride are replaced by electrons, the electron density of the crystalline C12A7 electride is $2.3 \times 10^{21}$ cm$^{-3}$. If the electron density of the crystalline C12A7 electride falls below $2.0 \times 10^{13}$ cm$^{-3}$, the electron density of the resulting amorphous C12A7 electride thin film formed using the target may be too low.

Note that the electron density of C12A7 electride may be measured by iodometry.

Iodometry is a titration method that involves immersing a sample made of C12A7 electride in an iodine water solution of 5 mol/l, adding and dissolving hydrochloric acid into the solution, and determining the amount of unreacted iodine included in the solution using sodium thiosulfate. In this case, owing to the dissolution of the sample, the iodine in the iodine water solution is ionized by the following reaction:

$$I_2 + 2e^- \rightarrow 2I^- \quad (1)$$

Also, in the case where the iodine water solution is titrated with sodium thiosulfate, the unreacted iodine is converted to sodium iodide by the following reaction:

$$2Na_2S_2O_3 + I_2 \rightarrow 2NaI + Na_2S_4O_6 \quad (2)$$

By subtracting the amount of iodine titrated from the above equation (2) from the amount of iodine present in the initial solution, the amount of iodine consumed by the reaction of the above equation (1) may be calculated. In this way, the electron density of the C12A7 electride sample may be measured. Note that iodometry can be applied to both crystalline C12A7 electrides and amorphous C12A7 electrides.

The electron density of crystalline C12A7 electride may be measured using absorption spectroscopy. Crystalline C12A7 electride has a unique light absorption characteristic around 2.8 eV, and as such, the electron density of the crystalline C12A7 electride may be obtained by measuring its absorption coefficient at around 2.8 eV. Note that in the case where the sample is a sintered body, the sintered body may be pulverized into powder, and the powder sample may be measured using the diffuse reflection method, for example.

The target obtained by the above process is used as a raw material source in forming a C12A7 electride thin film in the next step.

Note that the surface of the target may be polished by some mechanical means, for example, before the target is used for film formation.

In general, a bulk of crystalline C12A7 electride obtained through the conventional fabrication method may have a thin coating (foreign matter) formed on its surface. When a target having such a coating formed on its surface is used as is upon carrying out a film formation process, the composition of the thin film obtained by the film formation process may deviate from the desired composition ratio. However, by polishing the target surface before using the target in the film formation process, such problems may be effectively prevented.

(Step S120)

Next, a film is formed on a substrate by vapor deposition using the target fabricated in step S110 described above.

In the present description, the term "vapor deposition" collectively refers to film formation methods that involve vaporizing a target raw material and depositing the raw material on a substrate, including, for example, the physical vapor deposition (PVD) method, the pulsed laser deposition (PLD) method, the sputtering method, and the vacuum deposition method.

Note that among the various vapor deposition methods that may be used, the sputtering method may be particularly suitable. By using the sputtering method, a thin film may be deposited in a relatively uniform manner within a large area. Examples of the sputtering method include the DC (direct current) sputtering method, the high frequency sputtering method, the helicon wave sputtering method, the ion beam sputtering method, and the magnetron sputtering method.

Hereinafter, step S120 is described taking an example in which film formation is performed using the sputtering method.

In an embodiment of the present invention, the substrate temperature is not particularly limited, and for example, any temperature within a range from room temperature to 700° C. may be used. Note that in embodiments of the present invention, the substrate does not necessarily have to be "actively" heated. (However, the substrate temperature may "incidentally" rise as a result of the sputtering phenomenon, for example.) For example, the substrate temperature may be less than or equal to 500° C. (e.g. 200° C. or lower).

In the case where the substrate is not "actively" heated, a material that does not have adequate heat resistance to high temperatures exceeding 700° C. such as glass or plastic may be used as the material of the substrate, for example.

Note that the substrate may be in any size or shape. Also, in some embodiments, a heating process may be performed on the substrate in a vacuum atmosphere before an electride thin film is deposited thereon. For example, after exposing the substrate to the atmosphere, the substrate may be held under a vacuum of $10^{-6}$ Pa at 300° C. for 10 minutes. In this way, moisture absorbed by the substrate may be eliminated, and the surface of the substrate may be cleaned, for example.

The oxygen partial pressure at the time of film formation should be less than 0.1 Pa. The oxygen partial pressure is preferably 0.01 Pa or less, more preferably $1 \times 10^{-3}$ Pa or less, more preferably $1 \times 10^{-4}$ Pa or less, and more preferably $1 \times 10^{-5}$ Pa or less. When the oxygen partial pressure is greater than 0.1 Pa, there is a risk of oxygen being incorporated into the deposited thin film to cause a decrease in the electron density.

On the other hand, the hydrogen partial pressure at the time of film formation is preferably less than 0.004 Pa. If the hydrogen partial pressure is greater than or equal to 0.004 Pa, there is a risk of hydrogen or OH components being incorporated into the deposited thin film to cause a decrease in the electron density of the amorphous C12A7 electride thin film.

The sputtering gas used is not particularly limited. Sputtering gas may be a noble gas or an inert gas. An example of the inert gas includes $N_2$ gas. Examples of the noble gas include He (helium), Ne (neon), Ar (argon), Kr (krypton), and Xe (xenon). These gases may be used alone or in combination with other gases. Alternatively, the sputtering gas may be a reducing gas such as NO (nitric oxide).

Note that the pressure of the sputtering gas (internal pressure of the chamber) is not particularly limited and may be freely adjusted to obtain a desired thin film. In one particular example, assuming t(m) denotes the distance between the substrate and the target (target-substrate distance), and d(m) denotes the diameter of the gas molecule, the sputtering gas pressure (internal pressure of the chamber) P (Pa) may be adjusted to a pressure that satisfies the following condition:

$$8.9 \times 10^{-22}/(td^2) < P < 4.5 \times 10^{-20}/(td^2) \quad (3)$$

In this case, the mean free path of sputtered particles may be approximately equal to the target-substrate distance, and the sputtered particles may be prevented from reacting with residual oxygen. Also, in this case, a relatively simple and inexpensive vacuum apparatus with a relatively high back pressure may be used as the sputtering apparatus, for example.

By implementing the above steps, an amorphous C12A7 electride thin film may be formed on the substrate.

Note that the thickness of the amorphous C12A7 electride thin film is not particularly limited, but may be 50 μm or less, for example. The film thickness is preferably arranged to be 10 μm or less, and more preferably 2 μm or less. The film thickness may be at least 1 nm, for example.

The fact that the obtained thin film has a composition of C12A7 can be confirmed by composition analysis of the thin film. For example, whether the thin film has the composition of C12A7 may be evaluated by measuring the Ca/Al ratio of the thin film using the XPS method, the EPMA method, or the EDX method. If the film thickness is less than or equal to 100 nm, the XPS method may be used; if the film thickness is greater than or equal to 100 nm, the EPMA method may be used; and if the film thickness is greater than or equal to 3 μm, the EDX method may be used to analyze the thin film. Note, also, that whether the thin film is made of an amorphous C12A7 electride may be confirmed by measuring the light absorption characteristics of a sample of the thin film to determine whether light absorption occurs around a photon energy range of 4.6 eV in the manner described above.

Note that when the thin film is relatively thick, whether the thin film is made of an amorphous C12A7 electride may be confirmed using Raman spectrometry to determine whether a characteristic peak is detected at 186 $cm^{-1}$, for example.

Note that although an example using the sputtering method is described above as one exemplary method of fabricating an amorphous C12A7 electride thin film according to the present invention, a fabrication method of the present invention is not limited to the above example. In other embodiments, the above two steps (steps S110 and S120) may be modified, or an additional step may be included.

For example, before forming the amorphous C12A7 electride thin film on the substrate using the sputtering method in step S120 as described above, a pre-sputtering process (e.g. dry etching process) may be performed on the target.

By performing the pre-sputtering process, the surface of the target may be cleaned, and deposition of a thin film with a desired composition in the subsequent process step may be facilitated.

For example, when the target is used for a long period of time, oxygen may be incorporated into the surface of the target, possibly causing a decrease in the electron density of the crystalline C12A7 electride constituting the target. When such a target is used to form a thin film, the electron density of the deposited thin film may also decrease. Also, when the target is used for a long period of time, the composition of the target may deviate from its initial composition due to the differences in the sputtering rates of the components constituting the target (i.e. crystalline C12A7 electride). When such a target is used to form a thin film, the composition of the thin film may also deviate from the desired composition.

However, such problems may be prevented by performing a pre-sputtering process on the target.

Note that the pre-sputtering process may be performed before a new film formation process is performed, or each time the amount of time the target has been used reaches a predetermined value, for example.

Also, note that the gas used in the pre-sputtering process may be the same as the sputtering gas used during the film formation process or a different gas.

Examples of preferred gases that may be used in the pre-sputtering process include He (helium), Ne (neon), $N_2$ (nitrogen), Ar (argon) and/or NO (nitric oxide).

In addition to the above, various other modifications may be made to steps S110 and S120, and a new process may be added as well.

(Amorphous C12A7 Electride Thin Film)

According to another embodiment of the present invention, an amorphous C12A7 electride thin film is provided.

An amorphous C12A7 electride thin film according to an embodiment of the present invention has an electron density within a range that is greater than or equal to $2.0 \times 10^{18}$ $cm^{-3}$ and less than or equal to $2.3 \times 10^{21}$ $cm^{-3}$, and exhibits light absorption at a photon energy position of 4.6 eV. The electron density of the amorphous C12A7 electride thin film is preferably greater than or equal to $1 \times 10^{19}$ $cm^{-3}$, and more preferably greater than or equal to $1 \times 10^{20}$ $cm^{-3}$.

The above amorphous C12A7 electride thin film may be fabricated using the above-described fabrication method, for example.

Note that the electron density of the amorphous C12A7 electride thin film may be measured using iodometry as described above. Also, the bipolaron density of the amorphous C12A7 electride thin film may be obtained by multiplying the measured electron density by ½.

The film thickness of the amorphous C12A7 electride thin film is not particularly limited, but may be 10 μm or less (e.g. 2 μm or less). Also, the film thickness may be at least 1 nm, for example.

Note that the amorphous C12A7 electride thin film may be provided alone or the amorphous C12A7 electride thin film may be formed on a substrate and provided in such a state.

In the latter case, the material of the substrate is not particularly limited. For example, the substrate may be made of a material such as glass that does not have adequate heat resistance to high temperatures exceeding 700° C., for example.

The amorphous C12A7 electride thin film according to an embodiment of the present invention may be used as an electrode or a layer member such as an electron injection layer of an organic EL element, a discharge electrode, or a catalyst for chemical synthesis, for example.

The amorphous C12A7 electride thin film according to an embodiment of the present invention has conductive properties owing to hopping conduction of electrons within the cages. The DC electric conductivity of the amorphous C12A7 electride thin film at room temperature may be $10^{-9}$ $S \cdot cm^{-1}$ to $10^{-1}$ $S \cdot cm^{-1}$, or more preferably, $10^{-7}$ $S \cdot cm^{-1}$ to $10^{-3}$ $S \cdot cm^{-1}$, for example.

The amorphous C12A7 electride thin film according to an embodiment of the present invention may have an $F^+$ center having an electron trapped in an oxygen vacancy as a partial structure in addition to the bipolarons 5. The $F^+$ center has an electron surrounded by a plurality of $Ca^{2+}$ ions but does not have cages. The $F^+$ center has a light absorption band in the visible light range of 1.55 eV to 3.10 eV with a peak at 3.3 eV.

Note that the concentration of $F^+$ centers within the thin film is preferably less than $5 \times 10^{18}$ $cm^{-3}$, and in this way, the thin film may have a desirably high transparency. The concentration of F$^+$ centers is more preferably less than or equal to $1 \times 10^{18}$ cm$^{-3}$, and more preferably less than or equal to $1 \times 10^{17}$ cm$^{-3}$. Note that the concentration of F$^+$ centers may be measured by ESR based on the signal intensity of a g-factor of 1.998.

In the amorphous C12A7 electride thin film according to an embodiment of the present invention, the ratio of the light absorption coefficient at a photon energy of 3.3 eV to the light absorption coefficient at a photon energy of 4.6 eV may be less than or equal to 0.35.

The flatness of an amorphous C12A7 electride thin film is superior to that of a polycrystalline thin film because the amorphous C12A7 electride thin film does not have crystal grain boundaries. The RMS (root mean square) granularity of the surface of the amorphous C12A7 electride thin film according to an embodiment of the present invention may be within a range of 0.1 nm to 10 nm, and more preferably within a range of 0.2 nm to 5 nm, for example. Note that in a case where the amorphous C12A7 electride thin film is used in an organic EL element, the RMS granularity is preferably less than or equal to 2 nm, and in this way, device characteristics may be improved. Also, when the RMS granularity is 10 nm or greater, device characteristics may potentially be degraded, and therefore, a polishing process or the like may have to be additionally implemented, for example. Note that the RMS granularity may be measured using atomic force microscopy, for example.

Other Embodiment

According to another embodiment of the present invention, a fabrication method for forming an amorphous thin film is provided that involves using a target made of a crystalline C12A7 electride having an electron density within a range of $2.0 \times 10^{18}$ cm$^{-3}$ to $2.3 \times 10^{21}$ cm$^{-3}$, and forming an amorphous C12A7 electride thin film on a substrate by vapor deposition under a low-oxygen-partial-pressure atmosphere.

The amorphous thin film obtained in the present embodiment may be made of amorphous solid materials including calcium, aluminum, and oxygen, for example. That is, the amorphous thin film may be made of an electride of an amorphous oxidized material including calcium atoms and aluminum atoms. Note that amorphous states according to the present invention encompass amorphous structures containing microcrystals. In the amorphous thin film according to an embodiment of the present invention, the Ca/Al molar ratio is preferably within a range of 0.5 to 4.7, more preferably within a range of 0.6 to 3, and more preferably within a range of 0.8 to 2.5. Note that composition analysis of the thin film may be performed using the XPS method, the EPMA method, or the EDX method, for example.

The amorphous thin film of the present embodiment may have a composition that is different from the stoichiometric ratio of C12A7 and different from the composition ratio of the target used for fabricating the thin film. Note that in the case where the thin film is crystalline and the composition of the thin film is different from the stoichiometric ratio of C12A7, the thin film would be made of a mixture of a C12A7 crystal and a C3A(3CaO.Al$_2$O$_3$) crystal and/or a CA(3CaO.Al$_2$O$_3$) crystal. C3A crystals and CA crystals are insulators with relatively large work functions, and their electrical characteristics vary depending on the crystalline site. Also, the thermal characteristics and mechanical characteristics of these crystals vary, and they tend to form discontinuous crystal grain boundaries such that the surface flatness may be compromised. On the other hand, even when the composition of the amorphous thin film is different from the stoichiometric ratio of C12A7, because different phases such as the C3A phase and the CA phase are not formed, homogeneity and surface flatness may be achieved.

The electron density of the amorphous thin film is preferably within a range that is greater than or equal to $2.0 \times 10^{18}$ cm$^{-3}$ and less than or equal to $2.3 \times 10^{21}$ cm$^{-3}$. The electron density of the amorphous thin film is more preferably $1 \times 10^{19}$ cm$^{-3}$ or greater, and more preferably $1 \times 10^{20}$ cm$^{-3}$ or greater. Also, the amorphous thin film preferably exhibits light absorption at a photon energy range around 4.6 eV.

The amorphous thin film has semiconductor-like electrical characteristics, and has a low work function. The work function of the amorphous thin film may be within a range of 2.4 eV to 4.5 eV, or within a range of 2.8 eV to 3.2 eV, for example. Also, the amorphous thin film has high ionization potential. The ionization potential of the amorphous thin film may be within a range of 7.0 eV to 9.0 eV, or within a range of 7.5 eV to 8.5 eV, for example. The amorphous thin film according to the present embodiment has F$^+$ centers at a concentration of less than $5 \times 10^{18}$ cm$^{-3}$, and thus has a desirably high transparency. The concentration of F$^+$ centers is more preferably less than or equal to $1 \times 10^{18}$ cm$^{-3}$, and more preferably less than or equal to $1 \times 10^{17}$ cm$^{-3}$. Further, in the amorphous thin film according to the present embodiment, the ratio of the light absorption coefficient at a photon energy of 3.3 eV to the light absorption coefficient at a photon energy of 4.6 eV may be less than or equal to 0.35.

Note that descriptions of configurations, implementation modes, and analysis methods to be used in connection with the present embodiment that may be substantially identical to those described in connection with the previously described embodiments (e.g. steps S110 and S120) are hereby omitted.

EXAMPLES

In the following, specific examples of the present invention are described.

Example 1

Target Fabrication

First, a raw material powder was obtained by preparing and mixing CaO powder and Al$_2$O$_3$ powder to a molar ratio of 12:7. The raw material powder was heated to 1350° C. in air to fabricate a bulk of crystalline C12A7.

Then, the crystalline C12A7 bulk was pulverized into powder, and the powder was press-molded through cold isostatic pressing to obtain a crystalline C12A7 molded body. Further, the molded body was placed in a carbon crucible together with metal aluminum and heated to in a vacuum furnace. In the carbon crucible, the molded body and the metal aluminum were separately held. The temperature was heated to 1300° C. and held for 6 hours, and in this way, a crystalline C12A7 electride sintered body was obtained.

The sintered body was then cut into a disk shape with a thickness of 5 nm and a diameter of 3 inches, and the disk-shaped sintered body was fixed to a Cu backing plate using In to obtain a sputtering target (simply referred to as "target" hereinafter).

The electron density of the target was measured through light absorption measurement. The result of the measurement indicated that the electron density of the target was $8.5 \times 10^{20}$ cm$^{-3}$.

(Amorphous C12A7 Electride Thin Film Formation)

Next, the target fabricated in the above-described manner is used to form an amorphous C12A7 electride thin film on the surface of a substrate by sputtering.

A quartz substrate with a diameter of 80 mmφ and a thickness of 2.3 mm was used as the substrate in the present example.

An RF magnetron sputtering apparatus (by Canon Anelva Corporation) was used as the film forming apparatus. Film formation was performed in the following manner.

First, the target was mounted to a cathode of the apparatus. Then, air was evacuated from the interior of the apparatus to reduce the internal pressure to $2.7 \times 10^{-3}$ Pa or less, and He gas (pre-sputtering gas) was introduced into the apparatus thereafter. The He gas pressure was arranged to be 2.66 Pa.

Next, a shutter was placed between the target and the substrate in order to prevent vapor of the target from being transported toward the substrate. In such a state, a pre-sputtering process was performed on the target by applying a high frequency of 13.56 MHz at a power of 100 W to the cathode to cause plasma generation around the cathode. The power discharge was continued for 1.5 hours. In this way, the target surface was sputtered by He and a new surface was exposed.

After stopping the power discharge and evacuating gas from the interior of the apparatus, Ar gas (sputtering gas) was introduced into the apparatus. The Ar gas pressure was arranged to be 2.13 Pa. Note that the oxygen partial pressure of the introduced gas was less than $4.3 \times 10^{-7}$ Pa, and the hydrogen partial pressure was less than $1.1 \times 10^{-6}$ Pa. The oxygen partial pressure within the chamber is estimated to be less the $10^{-2}$ Pa.

Next, a high frequency power was applied using conditions substantially identical to those used in the above-described pre-sputtering process to generate plasma, and the shutter placed between the target and the substrate was removed.

Thereafter, the power discharge was continued for 1 hour, and a film formation process by sputtering (sputtering process) was performed on the substrate. Note that the substrate is not heated during this process.

In this way, a thin film was formed on the substrate. The thin film was formed to cover the entire surface of the substrate.

The above process flow from the pre-sputtering process to sputtering process is regarded as one cycle, and in the present example, a plurality of thin films with differing film thicknesses were fabricated by varying the number of cycles that were executed to fabricate the thin films.

The thickness of each of the thin films was measured using a stylus type surface roughness tester. The film thickness of the thin film after performing one cycle was approximately 180 nm. The film thickness of the thin film after performing two cycles was approximately 400 nm. The film thicknesses of the thin films after performing three cycles, four cycles, and five cycles were approximately 690 nm, approximately 770 nm, and approximately 1050 nm, respectively.

In the following, the thin film sample having a thickness of approximately 180 nm is referred to as "Sample 1", the thin film sample having a thickness of approximately 400 nm is referred to as "Sample 2", the thin film sample having a thicknesses of approximately 690 nm is referred to as "Sample 3", the thin film sample having a thickness of approximately 770 nm is referred to as "Sample 4", and the thin film sample having a thickness of approximately 1050 nm is referred to as "Sample 5".

(Evaluation)

The Ca (calcium) to Al (aluminum) ratios of the thin films corresponding to Samples 1-5 were measured using the EDX method. The measurement results are indicated in Table 1 below.

| SAMPLE | $Ca_xAl_{14}$ |
|---|---|
| 1 | (x=)12.1 |
| 2 | 11.6 |
| 3 | 11.9 |
| 4 | 11.5 |
| 5 | 12.6 |

As can be appreciated from Table 1, the thin films corresponding to Samples 1-5 each have a Ca:Al ratio of approximately 12:14. Based on the above, it could be confirmed that each of the above thin film samples has the composition of C12A7.

With respect to Sample 5, iodometry was performed to evaluate the electron density of the thin film. The titration result indicated that the electron density of the thin film corresponding to Sample 5 was approximately $(8.8 \pm 1.6) \times 10^{20}$ cm$^{-3}$. Because the target used in the other samples is the same target as that used in Sample 5, it can be estimated that the electron densities of the thin films of Samples 1-4 are about the same as the electron density of Sample 5.

Based on the above evaluations, it could be confirmed that the thin films of Samples 1-5 are each made of C12A7 electride.

Figure 3:
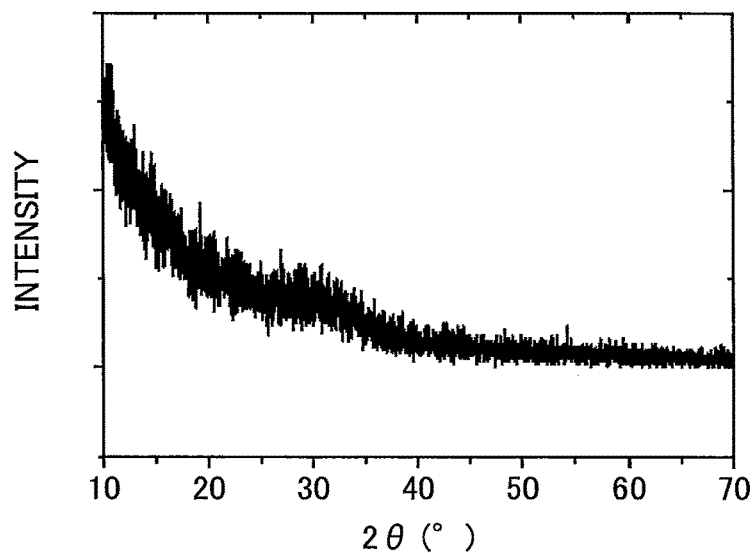
FIG. 3 is a graph illustrating X-ray diffraction measurement results of Sample 5.

Next, X-ray diffraction measurement was performed on the Samples 1-5. No peak was observed in any of the measurement results of the samples, and only a halo was observed. Based on the above results, it could be determined that the thin films of Samples 1-5 are all amorphous. FIG. 3 illustrates an X ray diffraction pattern obtained by measuring Sample 5 as an example.

Based on the above analysis results, it could be inferred that the thin films of Samples 1-5 are all made of C12A7 electride.

Next, the internal transmittance of each of the Samples 1-5 was measured.

Figure 4:
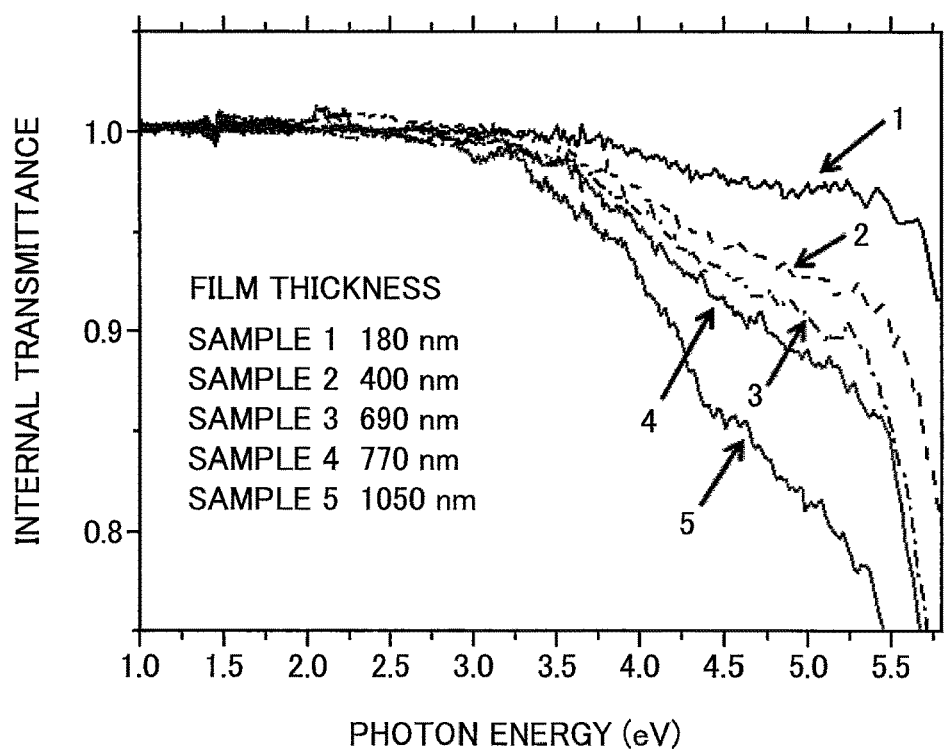
FIG. 4 is a graph illustrating internal transmittance measurement results of Samples 1-5.

FIG. 4 illustrates the internal transmittance measurement results of Samples 1-5. The internal transmittance of each of the samples was calculated based on measurement results of light transmittance and reflectance of each of the samples. Specifically, assuming T denotes the light transmittance, R denotes the reflectance, and I denotes the internal transmittance, their relationship may be represented by the following equation:

$$I = T/(1-R) \qquad (4)$$

It can be appreciated from FIG. 4 that the transmittance of each of the samples decreases around the point where the photon energy is approximately 4.6 eV. Such a decrease in the transmittance is less conspicuous at Sample 1 and becomes increasingly more conspicuous at Samples 2, 3, 4, and 5; that is, the decrease in the transmittance becomes more conspicuous as the film thickness increases. Based on the above, it may be presumed that the decrease in transmittance is caused by influences of the thin film; namely, light absorption of the thin film, rather than influences from the substrate such as defects on the substrate surface created by plasma, for example. Also, the internal transmittance of the samples at the visible light range of 1.55 eV to 3.10 eV is substantially equal to 1 indicating that the samples are transparent in visible light.

As described above, the bipolarons of amorphous C12A7 electride exhibit light absorption around the photon energy range of 4.6 eV. Thus, the measurement results of FIG. 4 suggest that Samples 1-5 include bipolarons within their thin films.

Thus, it can be appreciated from the above internal transmittance measurement results that the thin films of Samples 1-5 each correspond to amorphous C12A7 electride.

Figure 5:
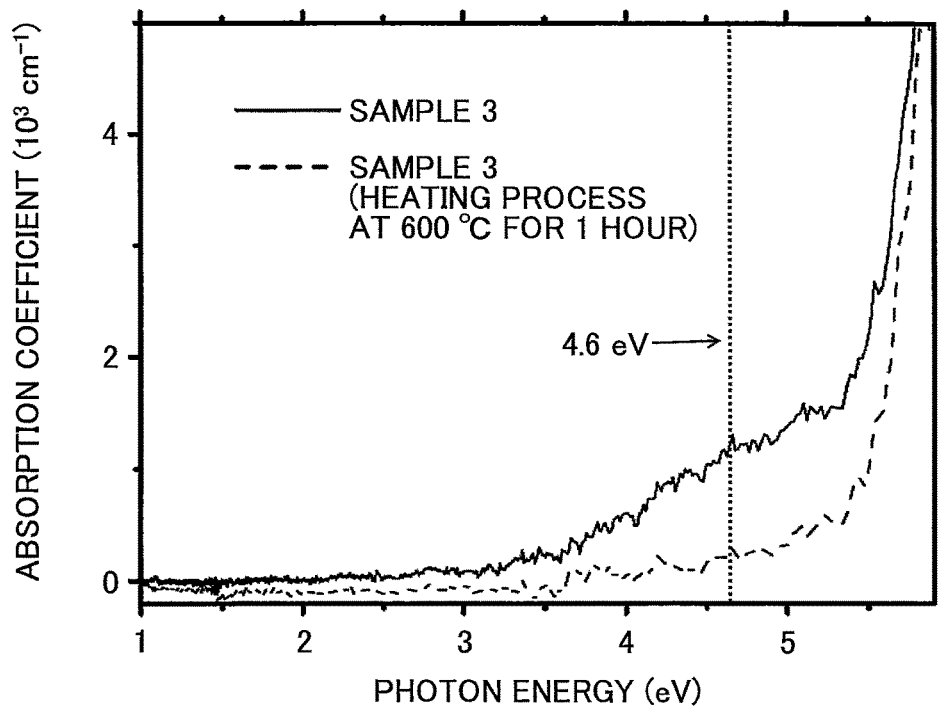
FIG. 5 is a graph illustrating the absorption coefficient of Sample 3 and the absorption coefficient of Sample 3 that has been subject to a heating process.

FIG. 5 illustrates an absorption coefficient curve of Samples 1-5 (solid line). The absorption coefficient curve may be calculated by normalizing the above internal transmittance measurement results with respect to the film thickness. Note that because the absorption coefficient curves of Samples 1-5 are substantially the same, only the absorption coefficient curve of Sample 3 (solid line) is illustrated in FIG. 5. FIG. 5 also illustrates an absorption coefficient curve of Sample 3 after a heating process is performed thereon (dashed line). The heating process on Sample 3 was performed in atmosphere at 600° C. for 1 hour.

It can be appreciated from the measurement results of FIG. 5 that an absorption peak at the position where the photon energy is around 4.6 eV can no longer be observed from the measurement result of Sample 3 that has undergone the heating process (the absorption rate at the corresponding position is less than 100 cm$^{-1}$). By performing the heating process, the thin film of the sample is oxidized and the electrons within the cages disappear. That is, the characteristic structure of the amorphous C12A7 electride as illustrated in FIG. 1 is lost as a result of performing the heating process, and the thin film is no longer an electride (conductive) thin film. Note that the absorption coefficient measurement accuracy may be ±100 cm$^{-1}$ depending on measurement conditions, and in such case, it may be presumed that light absorption can no longer be observed once the absorption coefficient is reduced to less than 200 cm$^{-1}$ at the photon energy position of around 4.6 eV.

Figure 6:
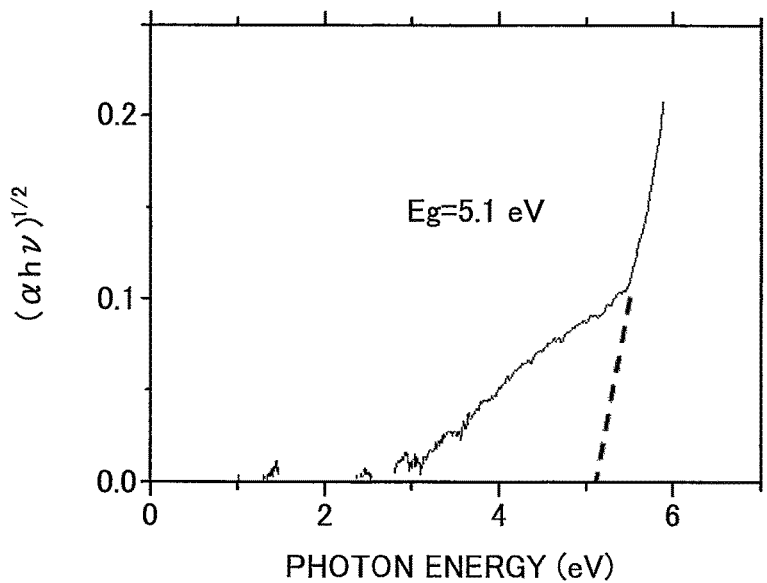
FIG. 6 is a graph illustrating a Tauc plot for Sample 5.

Based on a Tauc plot of Sample 5 as illustrated in FIG. 6, the optical band gap of Sample 5 was determined to be 5.1 eV. This value was a reasonable value in comparison to the optical band gap of crystalline C12A7 which is 5.9 eV.

In view of the above, it could be confirmed that the thin films of Samples 1-5 are made of amorphous C12A7 electride that include bipolarons with two adjoining cages each containing an electron as illustrated in FIG. 1.

Example 2

Sample 6 was fabricated by forming an amorphous C12A7 electride thin film on a substrate in the same manner as the above Example 1. However, in Example 2, the pre-sputtering process using He gas was not conducted. Instead, before using the crystalline C12A7 electride target, the surface of the crystalline C12A7 electride target was polished with a diamond file. Note that the sputtering process using Ar gas was conducted for 2 hours in the present example. Other processing conditions were the same as those used for fabricating Sample 1 of Example 1.

Figure 7:
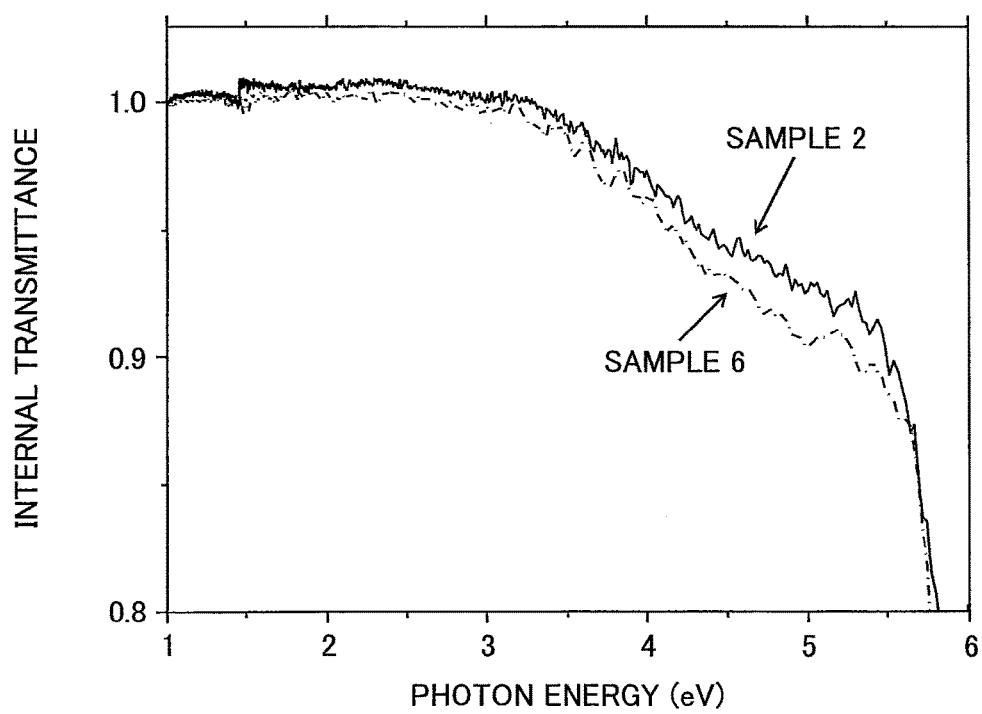
FIG. 7 is a graph illustrating internal transmittance measurement results of Sample 6 together with the internal transmittance measurement results of Sample 2.

FIG. 7 illustrates internal transmittance measurement results of Sample 6. Note that in FIG. 7, the internal transmittance measurement results of Sample 2 is indicated along with the internal transmittance measurement results of Sample 6.

As can be appreciated from FIG. 7, a substantial decrease in transmittance could be observed in Sample 6 at the position of the photon energy of 4.6 eV.

Thus, it could be confirmed that an amorphous C12A7 electride thin film has been formed on the substrate surface in Sample 6.

Example 3

(Work Function of Amorphous C12A7 Electride Thin Film)

A sample (Sample 7) having an amorphous C12A7 electride thin film with a thickness of 10 nm formed on an ITO was fabricated by performing the sputtering process for 4 minutes using a glass substrate with ITO (indium tin oxide) instead of a silica glass substrate. Note that other than the above processing conditions, Sample 7 was fabricated in the same manner as Example 1.

The work function of Sample 7 was measured by ultraviolet photoelectron spectroscopy. In order to obtain a clean surface, measurement was performed under ultra-high vacuum ($10^{-7}$ Pa), and organic matter was removed from the surface by Ar sputtering before measurement. Also, X-ray photoelectron spectroscopy was performed before and after the Ar sputtering process to confirm that the thin film sample has not been damaged. Further, a DC voltage (bias voltage) was applied to Sample 7 so that Sample 7 may be at a negative potential with respect to the measurement device. By applying such a bias voltage to the sample, influences of surface potential may be removed.

Figure 8:
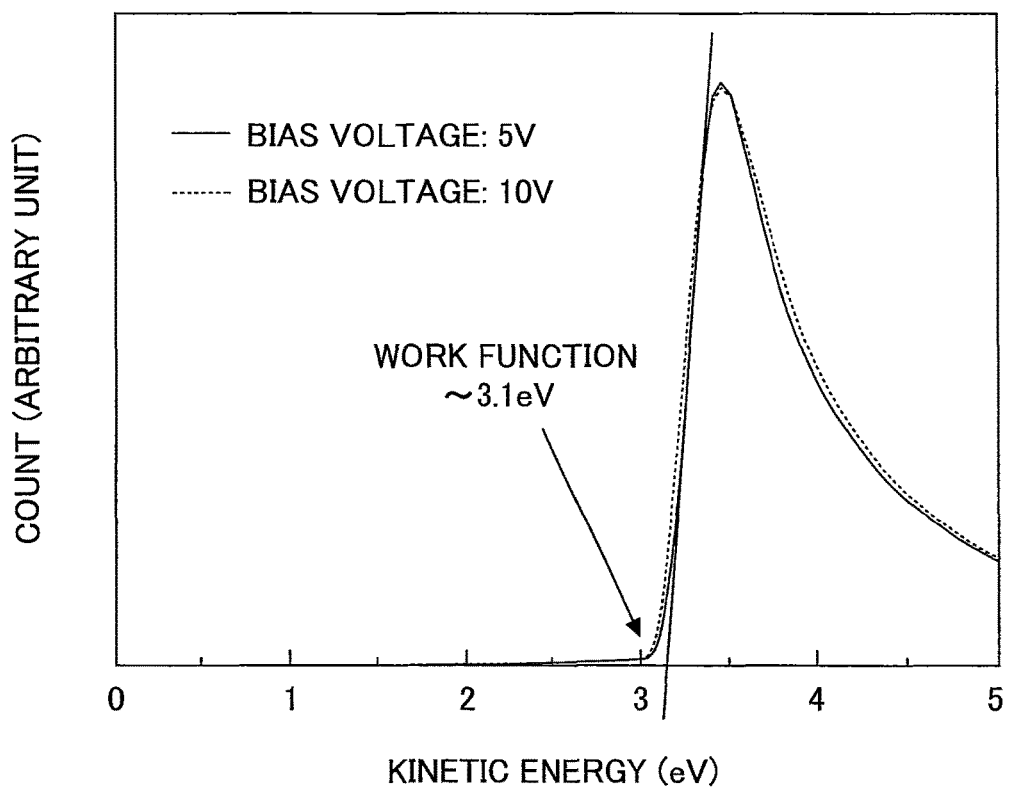
FIG. 8 is a graph illustrating the work function of Sample 7 measured by ultraviolet photoelectron spectroscopy.

FIG. 8 illustrates the kinetic energy distribution of electrons emitted from Sample 7 that is irradiated with ultraviolet light. As illustrated in FIG. 8, even when the bias voltage is changed from 5 V to 10 V, substantially the same spectrum may be obtained, and as such, it may be appreciated that Sample 7 is not charged up, and the spectral shape reflects the work function of the sample. Also, these results indicate that Sample 7 is electrically conductive. Based on the minimum kinetic energy of the photoelectrons in FIG. 8, the work function of Sample 7 was determined to be approximately 3.1 eV.

When the RMS roughness of the surface of the amorphous C12A7 electride thin film of Sample 7 within a 20×20 µm range was measured using an atomic force microscope, the RMS roughness was approximately 1.9 nm. On the other hand, when a similar measurement was conducted on the surface of the ITO film (polycrystalline film) on the glass substrate before forming the amorphous C12A7 electride thin film, the RMS roughness was approximately 4.6 nm. From the above results, it could be appreciated that the amorphous C12A7 electride thin film exhibits a high flatness and is therefore suitable for application to thin film devices. Also, it could be appreciated from the above results that the surface flatness may be improved by forming the amorphous C12A7 electride thin film on a polycrystalline thin film.

Example 4

An amorphous C12A7 electride thin film sample was formed on the surface of a substrate by sputtering using a crystalline C12A7 electride target having an electron density of 1.5×10$^{21}$ cm$^{-1}$ according to optical absorption measurements performed thereon. The target had a diameter of 2 inches.

An RF magnetron sputtering apparatus (manufactured by ULVAC, Inc.) was used as the film forming apparatus. The thin film sample was formed in the following manner.

First, the target was mounted to the cathode of the apparatus. Then, air was evacuated from the interior of the apparatus to reduce the pressure to $1\times10^{-5}$ Pa or lower, and Ar gas was introduced into the apparatus. The Ar gas pressure was adjusted to 0.21 Pa. The oxygen partial pressure of the introduced gas was less than approximately $4.3\times10^{-7}$ Pa. The partial pressures of the gas components of the atmosphere within the chamber before and after introducing the sputtering gas were measured using a mass spectrometer (residual gas analyzer MICROPOLE System manufactured by HORIBA STEC, Co., Ltd). Before introducing the sputtering gas, the partial pressure of H₂O was $3\times10^{-6}$ Pa, and the oxygen partial pressure was $1\times10^{-6}$ Pa. After introducing the Ar gas, the partial pressure of H₂O was below the measurement limit, and the oxygen partial pressure was $9\times10^{-6}$ Pa.

Then, a high-frequency power at 50 W was applied to generate plasma, the shutter arranged between the target and the substrate was removed, and film deposition was performed. Note that the distance between the target and the substrate was arranged to be 10 cm.

The light absorption coefficient of the formed thin film was calculated from the measurement results of light transmittance and reflectance of the sample. More specifically, assuming T denotes the light transmittance, R denotes the reflectance, t denotes the thickness, and A denotes the light absorption coefficient, their relationship may be represented by the following equation:

$$A = \mathrm{Ln}(T/(1-R))/t \quad (5)$$

Figure 9:
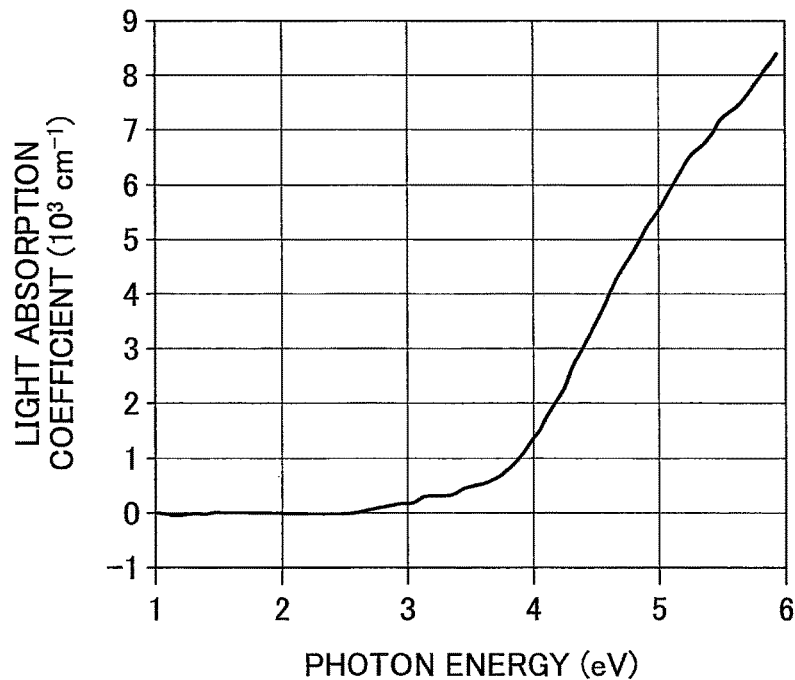
FIG. 9 is a graph illustrating the absorption coefficient of an amorphous thin film formed by vapor deposition under a low-oxygen-partial-pressure atmosphere using a target made of a crystalline C12A7 electride.

In FIG. 9, light absorption can be observed at a photon energy in the vicinity of approximately 4.6 eV. As described above, bipolarons of amorphous C12A7 electride indicate light absorption in the vicinity of a photon energy of 4.6 eV. Thus, the results of FIG. 9 suggest that the thin film sample includes bipolarons. Also, the ratio of the light absorption coefficient at a photon energy position of 3.3 eV with respect to the light absorption coefficient at the photon energy position of 4.6 eV was 0.35 or less.

Then, an amorphous thin film was formed on an ITO substrate using the same sputtering conditions as those described above, and the work function of the thins film was measured using ultraviolet photoelectron spectroscopy (UPS). The thickness of the amorphous thin film was arranged to be 10 nm.

In order to obtain a clean surface, measurement was performed under ultra-high vacuum ($10^{-7}$ Pa), and organic matter was removed from the surface by Ar sputtering before measurement. Also, X-ray photoelectron spectroscopy was performed before and after the Ar sputtering process to confirm that the thin film sample has not been damaged. Further, a DC voltage (bias voltage) was applied to the sample so that the sample would be at negative potential with respect to the measuring device. By applying such a bias voltage, influences of surface potential can be removed.

Figure 10:
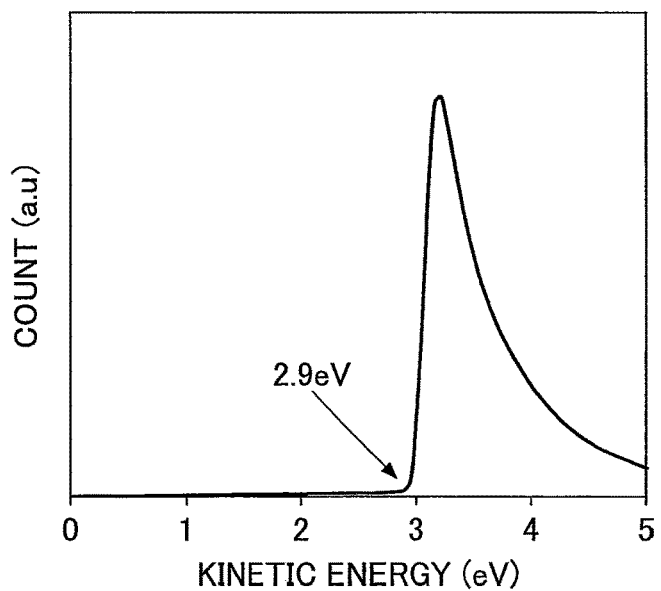
FIG. 10 is a graph illustrating a ultraviolet photoelectron spectroscopy measurement of kinetic energy spectra of photoelectrons in the amorphous thin film formed by vapor deposition under a low-oxygen-partial-pressure atmosphere using the target made of a crystalline C12A7 electride.

FIG. 10 illustrates the kinetic energy distribution of electrons that have been released from the sample that has been irradiated with ultraviolet light. In this case, even when the bias voltage is changed from 5 V to 10 V, substantially the same spectrum is obtained, and therefore, it can be appreciated that the sample is not charged up and that the spectral shape reflects the work function. Also, these results indicate that the sample has a conductivity. Based on the minimum kinetic energy of the photoelectrons in FIG. 10, the work function was determined to be approximately 2.9 eV.

Example 5

Amorphous thin film samples were formed on a quartz substrate and a nickel substrate under sputtering conditions substantially similar to those used in the above Example 4 other than that the electron density of the target was $1.4\times10^{21}$ cm$^{-3}$. Note, however, that in order to facilitate analysis, the film deposition time was altered from that used for fabricating the device in the above example, and the film thickness was increased. The obtained samples had a film thickness of 202 nm.

Figure 11:
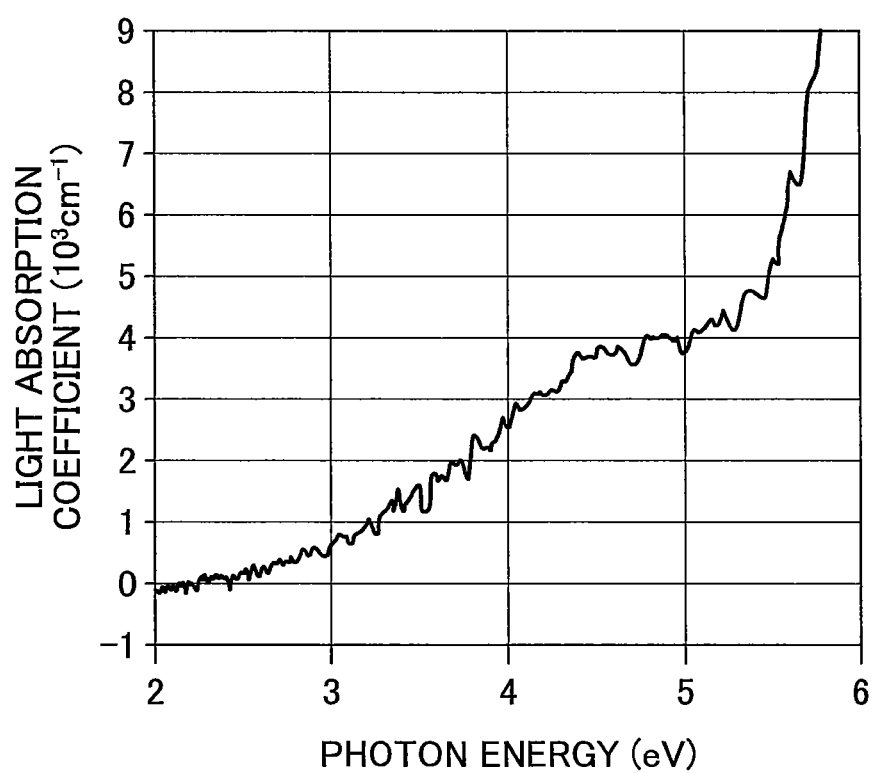
FIG. 11 is a graph illustrating the absorption coefficient of another amorphous thin film formed by vapor deposition under a low-oxygen-partial-pressure atmosphere using a target made of a crystalline C12A7 electride.

First, the sample was deposited on a quartz substrate, using the above equation (5), and the light absorption coefficient of the thin film was measured to obtain measurement results as illustrated in FIG. 11. In FIG. 11, light absorption can be observed at around a photon energy of approximately 4.6 eV. As described above, bipolarons of amorphous C12A7 electride indicate light absorption around a photon energy of 4.6 eV. Thus, the results in FIG. 11 suggest that the thin film sample includes bipolarons. Note, also, that the ratio of the light absorption coefficient at the position of 3.3 eV with respect to the light absorption coefficient at the position of 4.6 eV was 0.35 or less.

Next, the composition of the sample deposited on the nickel substrate was analyzed by EPMA. Note that a carbon thin film with a thickness of 50 nm was formed on the sample surface in order to avoid charge-up of electrons from the sample surface. Also, in order to avoid the influence of the underlying nickel, the acceleration voltage was set to 5 kV. The EPMA analysis results of the thin film revealed that the thin film sample included Ca, Al, and O, and that the Al/Ca molar ratio was 1.76.

Example 6

An amorphous thin film sample was formed on a surface of a substrate by sputtering using a crystalline C12A7 electride target having an electron density of $1.4\times10^{21}$ cm$^{-1}$ according to light absorption measurements performed thereon. The target diameter was 2 inches.

An RF magnetron sputtering apparatus (manufactured by ULVAC, Inc.) was used as the film forming apparatus. The thin film sample was formed in the following manner.

First, a Flat-ITO substrate manufactured by Geomatec Co, Ltd. was prepared. This substrate has a 150-nm-thick ITO film formed on a glass substrate. Then, the target was mounted to the cathode of the apparatus. Then, air was evacuated from the interior of the apparatus to reduce the pressure to $5\times10^{-4}$ Pa or less, and Ar gas was introduced into the apparatus. The Ar gas pressure was arranged to be 0.5 Pa. The oxygen partial pressure of the introduced gas was less than approximately $4.3\times10^{-7}$ Pa, the oxygen partial pressure within the chamber was estimated to be less than $10^{-3}$ Pa.

A high frequency power at 50 W was applied to generate plasma, the shutter arranged between the target and the substrate was removed, and film deposition was performed. The distance between the target and the substrate was adjusted to 10 cm, and sputtering was conducted for 90 seconds.

Figure 12:
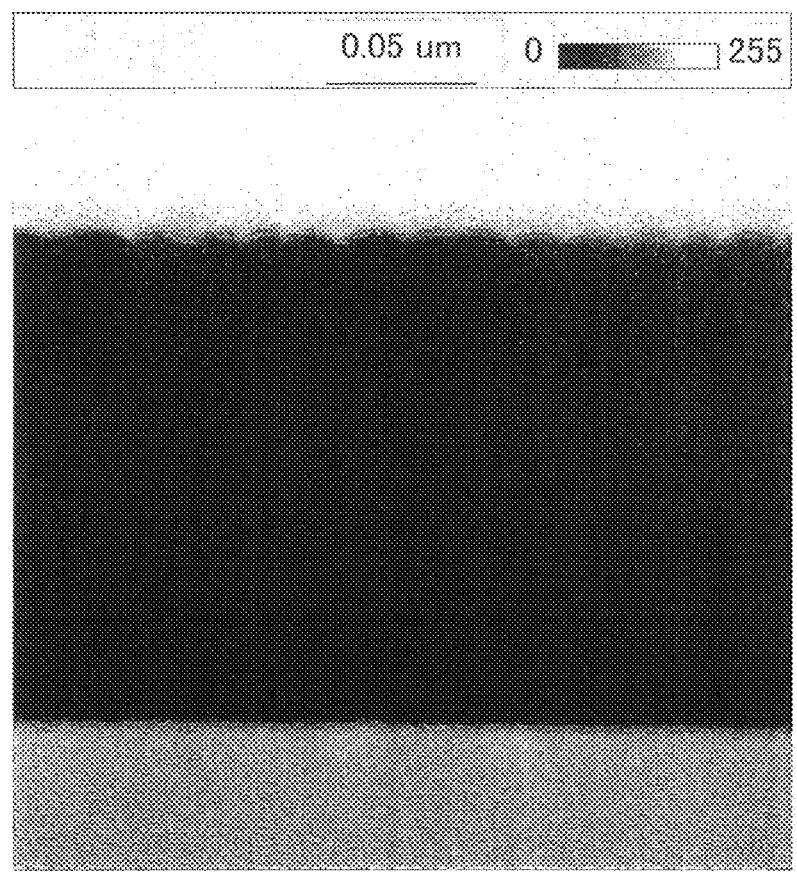
FIG. 12 is a cross-sectional STEM image of the amorphous thin film formed by vapor deposition under a low-oxygen-partial-pressure atmosphere using a target of a crystalline C12A7 electride.
Figure 13:
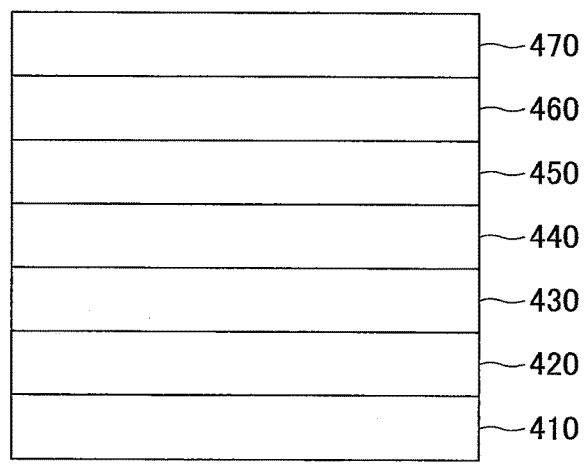
FIG. 13 schematically illustrates a configuration of an organic EL element fabricated according to an embodiment of the present invention.

FIG. 12 is a cross-sectional STEM image of the thin film. It can be appreciated from FIG. 12 that a layer with a thickness of approximately 10 nm has been deposited on the ITO film by the sputtering process. Note that Al—Ca—O was detected from this layer by TEM-EDX.

Example 7

An organic EL element was fabricated in the following manner, and their characteristics were evaluated. The organic EL element was configured by arranging a cathode as the bottom electrode on a glass substrate, and arranging an electron injection layer, an electron transport/light-emitting layer, a hole transport layer, a hole injection layer, and an anode as the top electrode in this order.

(Sample Fabrication)

Organic EL elements 404 and 405 were fabricated in the following manner.

First, a 30×30 mm Flat-ITO substrate manufactured by Geomatec CO., Ltd. was prepared as the substrate. The substrate has a 150-nm-thick ITO film formed on non-alkali glass.

A Kapton tape cut to a width of 1 mm was adhered to the ITO substrate and then immersed in an etching solution for 2 minutes to remove the ITO from portions of the substrate not covered by the Kapton tape. The etching solution was prepared by fabricating a water solution including $FeCl_3 \cdot 6H_2O$ and ion exchanged water at a weight ratio of 1:1 and adding concentrated hydrochloric acid at the same weight as the water solution. The temperature of the etching solution was adjusted to 45° C.

Then, the Kapton tape was removed, and the substrate was subject to ultrasonic cleaning with a neutral detergent for 5 minutes, followed by ultrasonic cleaning in pure water for 5 minutes, and this cleaning process was carried out twice. Further, the substrate was subject to ultrasonic cleaning in acetone for 5 minutes, followed by ultrasonic cleaning in IPA for 5 minutes, and this cleaning process was carried out twice. Finally, the substrate was immersed in boiling IPA, and was slowly taken out.

A resulting glass substrate 410 having the 1-mm-wide ITO formed thereon as wiring (cathode 420) was then introduced into an apparatus having a sputtering film deposition chamber, a vacuum deposition chamber, and a glove box that are interconnected, and air was evacuated from the apparatus to reduce the pressure to approximately $3 \times 10^{-5}$ Pa. Then, an amorphous thin film was deposited on top of the cathode 420, as an electron injection layer 430.

The amorphous thin film was formed by sputtering using a 2-inch-diameter crystalline C12A7 electride target having an electron density of $1.4 \times 10^{21}$ cm$^{-3}$. Ar gas was used as the sputtering gas, and the pressure of the introduced gas was set to 0.5 Pa. The oxygen partial pressure of the introduced gas was adjusted to be less than approximately $4.3 \times 10^{-7}$ Pa. The oxygen partial pressure in the chamber would presumably be less than $10^{-3}$ Pa. The distance (TS distance) between the sample and the target was arranged to be 10 cm. Also, the output of an RF power supply was arranged to be 50 W. Note that a pre-sputtering process using Ar gas was performed prior to carrying out the present film deposition process. The glass substrate 410 was not actively heated.

The thickness of the resulting amorphous thin film was approximately 5 nm.

Then, the glass substrate 410 having the electron injection layer 430 (and the cathode 420) formed thereon was introduced into the vacuum deposition chamber of the apparatus, and an Alq3 layer was formed as an electron transport/light-emitting layer 440. The thickness of the Alq3 layer was arranged to be approximately 50 nm. Then, an α-NPD layer was formed as a hole transport layer 450. The thickness of the α-NPD layer was arranged to be approximately 50 nm. Also, a MoO$_3$ layer was formed as a hole injection layer 460. The thickness of the MoO$_3$ layer was arranged to be approximately 0.8 nm.

Note that the Alq3 layer, the α-NPD layer and the MoO$_3$ layer were formed on the 20×20 mm region to completely cover the electron injection layer 430, using a metal mask. The degree of vacuum during the film deposition was arranged to be approximately $8 \times 10^{-6}$ Pa.

Then, an anode 470 with a width of 1 mm was formed by vapor deposition to be orthogonal to the cathode 420. That is, a 1×1 mm region where the cathode 420 and the anode 470 overlap corresponds to a region energized upon being applied a voltage. In the present example, silver was deposited to have a thickness of 80 nm as the anode 470.

By implementing the above steps, the organic EL element 404 including the glass substrate 410, the cathode 420 made of ITO, the electron injection layer 430 made of an amorphous thin film, the electron transport/light-emitting layer 440 made of Alq3, the hole transport layer 450 made of α-NPD, the hole injection layer 460 made of MoO$_3$, and the anode 470 made of silver was fabricated.

Next, the organic EL element 405 was fabricated as a comparative example. The organic EL element 405 is substantially identical to the organic EL element 404, except that it does not include the electron injection layer 430.

(Evaluation of Organic EL Element)

Next, the voltage and the luminance of the above organic EL elements 404 and 405 were measured. The measurements were conducted by determining the luminance obtained upon applying a predetermined voltage between the cathode 420 and the anode 470 of the organic EL element 404 or 405 within a glove box that is purged of nitrogen. Note that a luminance meter (BM-7A) manufactured by TOPCOM was used to measure the luminance.

Figure 14:
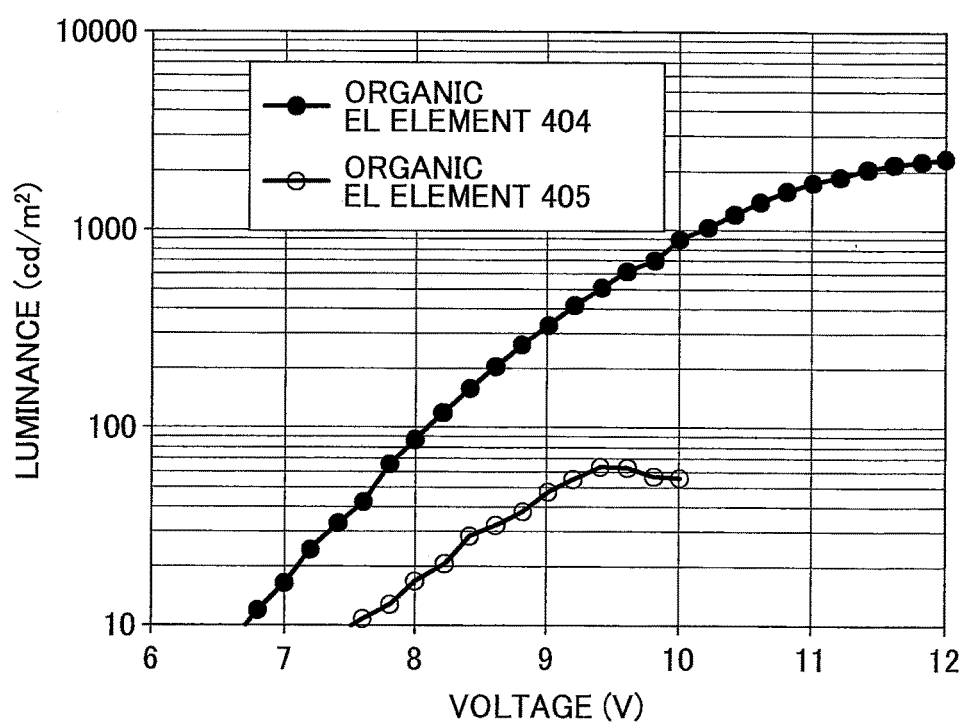
FIG. 14 is a graph illustrating light emission evaluation test results of organic EL elements 404 and 405.

FIG. 14 illustrates the measurement results of the voltage and the luminance of organic EL elements 404 and 405. Light emission by the organic EL element 404 having the electron injection layer 403 made of an amorphous thin film could be observed at approximately 6.8 V, and light emission at 2000 cd/m$^2$ was observed at approximately 12 V. On the other hand, with respect to the organic EL element 405 that does not include an electron injection layer, light emission was observed at approximately 7.5 V, and light emission at 60 cd/m$^2$ was observed at approximately 9.4 V. Because the difference between the organic EL elements 404 and 405 lies in the presence/absence of the electron injection layer, it could be confirmed that by including the electron injection layer, electron injection into Alq3 may be increased and light emission characteristics may be improved.

Example 8

Organic EL elements were fabricated in the following manner, and their characteristics were evaluated. The organic EL elements were configured by arranging a cathode as the bottom electrode on a glass substrate, and arranging an electron injection layer, an electron transport/light-emitting layer, a hole transport layer, a hole injection layer, and an anode as the top electrode in this order. The organic EL elements were further configured to extract light from the anode side.

(Sample Fabrication)

Organic EL elements 406 and 407 were fabricated in the following manner.

First, a 30 mm×30 mm×0.7 mm non-alkali glass substrate was prepared as the substrate. The substrate was subject to ultrasonic cleaning with a neutral detergent for 5 minutes, followed by ultrasonic cleaning in pure water for 5 minutes, and this cleaning process was carried out twice. Further, the substrate was subject to ultrasonic cleaning in acetone for 5 minutes, followed by ultrasonic cleaning in IPA for 5 minutes, and this cleansing process was carried out twice. Finally, the substrate was immersed in boiling IPA, and was slowly taken out.

The resulting glass substrate 410 after the cleaning process was then introduced into an apparatus having a sputtering film deposition chamber, a vacuum deposition chamber, and a glove box that are interconnected, and air was evacuated from the apparatus to reduce the pressure to approximately $3 \times 10^{-5}$ Pa. Then, the glass substrate was introduced into the vacuum deposition chamber of the apparatus.

Then, a 1-mm-wide aluminum film with a thickness of 80 nm was formed on the glass substrate 410 by vacuum vapor deposition as the cathode 420 using a metal mask.

Then, the glass substrate 410 having the cathode 420 formed thereon was introduced into the sputtering film deposition chamber, and an amorphous thin film was formed on the cathode 420 as the electron injection layer 430.

The amorphous thin film was formed by sputtering using a 2-inch-diameter crystalline C12A7 electride target having an electron density of $1.4 \times 10^{21}$ cm$^{-3}$. Ar gas was used as the sputtering gas, and the pressure of the introduced gas was set to 0.5 Pa. The oxygen partial pressure of the introduced gas was adjusted to be less than approximately $4.3 \times 10^{-7}$ Pa. The oxygen partial pressure in the chamber would presumably be less than $10^{-3}$ Pa. The distance (TS distance) between the sample and the target was arranged to be 10 cm. Also, the output of an RF power supply was arranged to be 50 W. Note that a pre-sputtering process using Ar gas was performed prior to carrying out the present film deposition process. The glass substrate 410 was not actively heated.

The thickness of the resulting amorphous thin film was approximately 2 nm.

Then, the glass substrate 410 having the electron injection layer 430 (and the cathode 420) formed thereon was introduced into the vacuum deposition chamber of the apparatus, and an Alq3 layer was formed as the electron transport/light-emitting layer 440. The thickness of the Alq3 layer was arranged to be approximately 50 nm. Then, an α-NPD layer was formed as the hole transport layer 450. The thickness of the α-NPD layer was arranged to be approximately 50 nm. Also, a MoO$_3$ layer was formed as the hole injection layer 460. The thickness of the MoO$_3$ layer was arranged to be approximately 0.8 nm.

Note that the Alq3 layer, the α-NPD layer and the MoO$_3$ layer were formed over the entire 20×20 mm area to completely cover the electron injection layer 430 using a metal mask. The degree of vacuum during the film deposition process was arranged to be approximately $8 \times 10^{-6}$ Pa.

Then, the anode 470 with a width of 1 mm was formed to be orthogonal to the cathode 420. That is, a 1×1 mm region where the cathode 420 and the anode 470 overlap corresponds to a region energized upon being applied a voltage. Note that gold with a thickness of 5 nm was deposited as the anode 470.

By implementing the above steps, the organic EL element 406 including the glass substrate 410, the cathode 420 made of aluminum, the electron injection layer 430 made of an amorphous thin film, the electron transport/light emitting layer 440 made of Alq3, the hole transport layer 450 made of α-NPD, the hole injection layer 460 made of MoO$_3$, and the anode 470 made of gold was fabricated.

Also, the organic EL element 407 was fabricated as a comparative example. The organic EL element 407 was fabricated in the same manner as the organic EL device 406 except that LiF was used as the electron injection layer 430. The LiF layer was deposited by vacuum deposition to have a thickness of 0.5 nm.

(Evaluation of Organic EL Element)

Then, the voltage and the luminance of the organic EL elements 406 and 407 were measured. The measurements were conducted by determining the luminance obtained when a predetermined voltage is applied between the cathode 420 and the anode 470 of the organic EL element 406 or 407 in a glove box purged of nitrogen. The luminance meter (BM-7A) manufactured by TOPCOM was used to measure the luminance.

Figure 15:
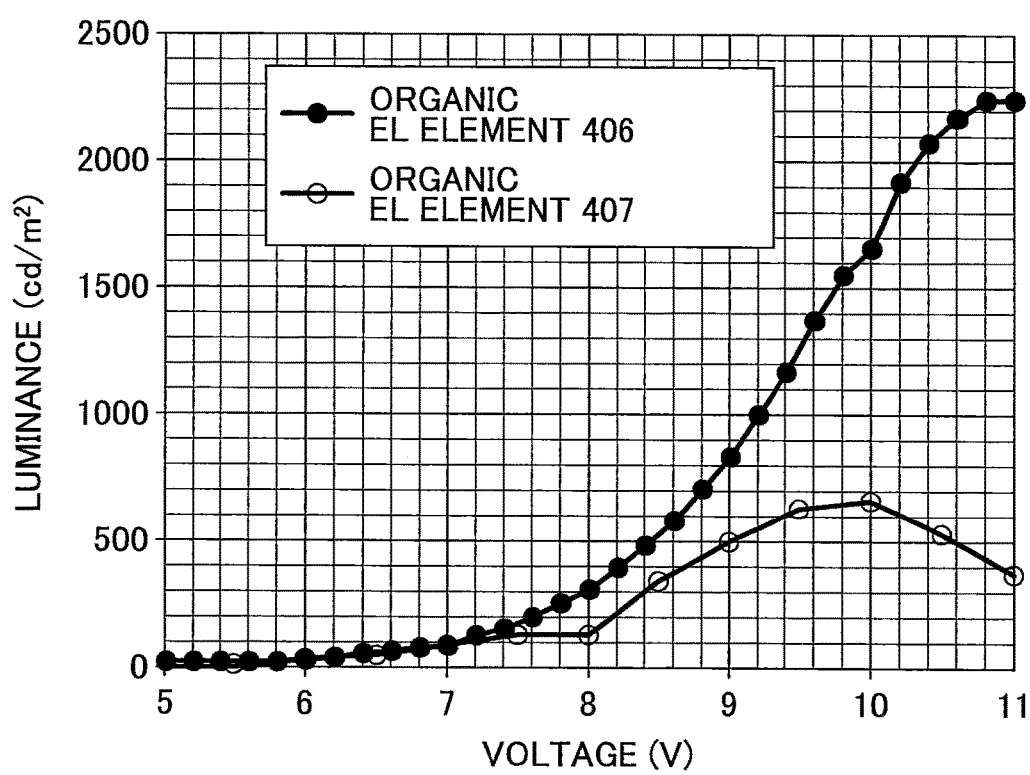
FIG. 15 is a graph illustrating light emission evaluation test results of organic EL elements 406 and 407.

FIG. 15 illustrates the measurement results of the voltage and luminance of the organic EL elements 406 and 407. With respect to the organic EL element 406 including the electron injection layer made of an amorphous thin film, light emission of 1600 cd/m$^2$ was observed at approximately 10 V. On the other hand, with respect to the organic EL element 407 including the electron injection layer made of LiF, light absorption of 600 cd/m$^2$ was observed at about 10 V. Because the difference between the organic EL elements 406 and 407 lies in the electron injection layer, it could be confirmed that by using the amorphous thin film as the electron injection layer 430, electron injection into Alq3 may be increased and light emission characteristics may be improved.

Further, the present invention is not limited to these embodiments, but various variations and modifications may be made without departing from the scope of the present invention.

What is claimed is:

1. A C12A7 electride thin film fabrication method, comprising:

forming an amorphous C12A7 electride thin film on a substrate by vapor deposition under an atmosphere including oxygen, hydrogen, and a sputtering gas using a target made of a crystalline C12A7 electride having an electron density within a range of $2.0 \times 10^{18}$ cm$^{-3}$ to $2.3 \times 10^{21}$ cm$^{-3}$, wherein;

an oxygen partial pressure of the oxygen in the atmosphere is less than or equal to 0.0001 Pa, and a hydrogen partial pressure of the hydrogen in the atmosphere of less than 0.004 Pa; and when t (m) denotes a distance between the substrate and the target, and d(m) denotes a diameter of a gas molecule of a sputtering gas, a sputtering gas pressure P (Pa) of the sputtering gas in the atmosphere is adjusted to satisfy:

$$8.9 \times 10^{-22}/(td^2) < P < 4.5 \times 10^{-20}/(td^2).$$

2. The fabrication method as claimed in claim 1, wherein a surface polishing process is performed on the target.

3. The fabrication method as claimed in claim 1, wherein the vapor deposition corresponds to sputtering.

4. The fabrication method as claimed in claim 3, wherein the sputtering is performed using at least one type of gas selected from a group consisting of He (helium), Ne (neon), N$_2$ (nitrogen), Ar (argon), NO (nitric oxide), Kr (krypton), and Xe (xenon).

5. The fabrication method as claimed in claim 1, wherein a pre-sputtering process is performed on the target.

6. The fabrication method as claimed in claim 5, wherein the pre-sputtering process is performed using at least one type of gas selected from a group consisting of He (helium), Ne (neon), N$_2$ (nitrogen), Ar (argon), and NO (nitric oxide).

7. The fabrication method as claimed in claim 1, wherein the amorphous C12A7 electride thin film has a thickness less than or equal to 10 µm.

8. The fabrication method as claimed in claim 1, wherein the substrate is used in a non-heated state.

9. The fabrication method as claimed in claim 1, wherein the substrate corresponds to a glass substrate.

10. A fabrication method, comprising:
   forming an amorphous thin film by vapor deposition under an atmosphere including oxygen, hydrogen, and a sputtering gas using a target made of a crystalline C12A7 electride having an electron density within a range of $2.0 \times 10^{18}$ cm$^{-3}$ to $2.3 \times 10^{21}$ cm$^{-3}$,
   wherein;
   an oxygen partial pressure of the oxygen in the atmosphere is less than or equal to 0.0001 Pa, and a hydrogen partial pressure of the hydrogen in the atmosphere of less than 0.004 Pa; and
   when t (m) denotes a distance between the substrate and the target, and d(m) denotes a diameter of a gas molecule of a sputtering gas, a sputtering gas pressure P (Pa) of the sputtering gas in the atmosphere is adjusted to satisfy:

$$8.9 \times 10^{-22}/(td^2) < P < 4.5 \times 10^{-20}/(td^2).$$

11. The fabrication method as claimed in claim 1, wherein, when the sputtering gas comprises at least two gases, a sum of partial pressures of the at least two gases is adjusted to satisfy the sputtering gas pressure P.

12. The fabrication method as claimed in claim 10, wherein, when the sputtering gas comprises at least two gases, a sum of partial pressures of the at least two gases is adjusted to satisfy the sputtering gas pressure P.

* * * * *